(12) United States Patent
Otoi et al.

(10) Patent No.: US 6,682,797 B1
(45) Date of Patent: Jan. 27, 2004

(54) CONTAMINATION RESISTANT CYCLIC OLEFIN CONTAINER

(75) Inventors: Kenji Otoi, Kawasaki (JP); Teruhiko Suzuki, Kawasaki (JP)

(73) Assignee: Nippon Zeon Co., Ltd., Tokyo (JP)

( * ) Notice: Subject to any disclaimer, the term of this patent is extended or adjusted under 35 U.S.C. 154(b) by 0 days.

(21) Appl. No.: 09/136,373

(22) Filed: Aug. 19, 1998

(30) Foreign Application Priority Data

Aug. 28, 1997 (JP) .............................................. 9-247837

(51) Int. Cl.⁷ ................................................. B29D 22/00
(52) U.S. Cl. .................................................... 428/36.92
(58) Field of Search ............................... 428/357, 36.92

(56) References Cited

U.S. PATENT DOCUMENTS 5,011,730 A * 4/1991 Tenney et al. ............... 428/209
5,191,026 A * 3/1993 Nishi et al. ............... 525/332.1
5,366,812 A * 11/1994 Takahashi et al. ........... 428/523
5,665,795 A * 9/1997 Koushima et al. ........... 523/223
5,880,241 A * 3/1999 Brookhart et al. ........... 526/348

FOREIGN PATENT DOCUMENTS

JP         07231928 A   *  6/1995
JP         08031921     *  2/1996
JP         80831923     *  2/1996
JP         11074337     *  3/1999

* cited by examiner

Primary Examiner—Sandra M. Nolan
(74) Attorney, Agent, or Firm—Armstrong, Kratz, Quintos, Hanson & Brooks, LLP

(57) ABSTRACT

A container comprising a body made of a thermoplastic resin and a lid made of a thermoplastic resin, characterized in that at least one of the body and the lid is molded from a thermoplastic cyclic olefin resin. Said container hardly causes contamination of the content therein with water or organic substances permeating through the container from the outside or released from the container per se, and, besides, hardly causes contamination of the content with fine dust in handling.

41 Claims, 2 Drawing Sheets

CONTAMINATION RESISTANT CYCLIC OLEFIN CONTAINER

BACKGROUND OF THE INVENTION

The present invention relates to containers made of thermoplastic resins, and particularly to containers made of thermoplastic resins which are suitable for carrying wafers for the production of semiconductors in the production steps of semiconductors and which are inhibited from contamination of their contents.

Thermoplastic resin containers are used in various industrial fields because they are light in weight and can be mass produced. For example, containers made by injection molding polystyrene resins are used as cases for office supplies and consumers' goods, closed containers made of polypropylene or containers made of foamed styrol are used for foods, containers made of polyethylene terephthalate resin are used for liquid beverages, and polycarbonate resins are used for containers required to have mechanical strength, e.g., pressure containers such as filter housings.

In some uses of containers, their contents are very susceptible to contamination caused by the containers or the environment. For example, containers for storing and carrying wafers ursed for the production of semiconductors are required to protect effectively the wafers from external contamination substances such as water and chemical substances and, furthermore, the containers per se are required not to generate contaminating substances such as water and chemical substances (mainly organic gaseous substances). For instance, the surface of fresh wafers before being subjected to processing has a contact angle with water of nearly 0° (normally 10° or less) in the state of no organic substances attaching to the surface, but they are readily affected by the environment in which they are stored, and even a slight amount, e.g., less than about 10 ppm, of organic substances present in the environment causes increase of the contact angle with water in several hours to several days and these wafers can no longer be used. When chemical amplification type photoresists are stored after exposure, they are influenced in several minutes by basic organic substances contained in the environment even in a slight amount of less than about 10 ppb, and the desired resist patterns cannot sometimes be obtained. Therefore, containers used for storing and carrying these contents are required to exclude the outside contaminating substances and, in addition, the containers per se are required not to generate contamination substances.

High-density or low-density polyethylene resin containers and polypropylene resin containers are superior in chemical resistance and solvent resistance, and are used as wide-mouthed bottles for various chemicals and as sealed containers for foods such as Tapper Ware (registered trademark for containers of Tapper Ware Co., Ltd.) since they are superior in flexibility and can provide a sealed structure comprising a combination of a convex portion and a concave portion between a body and a lid. However, polyethylene resins and polypropylene resins contain a considerable amount of components having a low molecular weight and impurities resulting from polymerization catalysts, which are continuously and gradually released (for example, in the form of a gas) in the containers. Thus, these containers are unsuitable for the uses highly susceptible to contamination, such as those for wafers in the production of semiconductors. Another problem is that these resins exhibit a high shrinkage rate at the time of injection molding, and are insufficient in dimensional accuracy as containers for containing contents of high accuracy, for example, wafers used for the production of semiconductors.

Polystyrene resins are used as general-purpose resins for various containers such as for foods, office supplies and leisure goods, but suffer from the problem that they are insufficient in mechanical strengths, especially, impact resistance, and the containers are broken by small impact. Thus, these containers lack reliability in storing expensive contents such as wafers used for the production of semiconductors. Moreover, since polystyrene resins contain low-molecular weight components and impurities resulting from polymerization catalysts, they are unsuitable for the uses highly susceptible to contamination as the above-mentioned polyethylene resins are unsuitable.

Polyethylene terephthalate resins can be injection molded and are high in dimensional accuracy, but since they contain many hydroxyl groups or ester bonds in the molecule, they cause problems in that they absorb water or organic substances and are apt to release the absorbed water or organic substances and, besides, water or organic substances readily permeate them. Furthermore, polyethylene terephthalate resins contain low-molecular weight components and impurities resulting from polymerization catalysts, and, hence, the containers made therefrom are unsuitable for the uses highly susceptible to contamination.

Polycarbonate resins can be injection molded and are high in dimensional accuracy and impact resistance, and, therefore, are used for various containers needed to have mechanical strength. However, since they contain many hydroxyl groups or ester bonds in the molecule, they cause problems in that they absorb water or organic substances and are apt to release the absorbed water or organic substances and, besides, water or organic substances readily permeate them. Furthermore, polycarbonate resins contain low-molecular weight components and impurities resulting from polymerization catalysts, and, hence, the containers made therefrom are unsuitable for the uses highly susceptible to contamination.

On the other hand, since cyclic olefin resins are superior in transparency, heat resistance and chemical resistance, use of them for various containers is proposed. For instance, JP-A-3-726, JP-A-7-231928 and East German Patent DD230828 disclose that bottles made by blow molding or injection molding cyclic olefin resins can be used as various containers. The containers disclosed in these documents are used without lids or with rubber stoppers. Furthermore, JP-A-7-126434 discloses that since cyclic olefin resins are less in impurities and hardly contaminate the surface of wafers used for the production of semiconductors, they are suitable as wafer carriers. Wafer carriers are open containers in which wafers are stored in a row.

Semiconductor devices (including starting materials therefor and semi-finished products in the course of production of the devices) must be prevented from being spoiled with dust by all means because adherence of the dust coming from the air or treating chemicals to the surface of the devices (usually the dust of about 0.2 $\mu$m, and even the fine dust of less than 0.1 $\mu$m in the recent leading semiconductor production process causes problems) causes reduction of yield and deterioration of performance. Thus, the semiconductor devices must be prevented from adherence of dust and are usually handled in a dustless room called a clean room. Therefore, it is preferred that the containers which store and carry them generate no dust and furthermore no dust enters the containers in handling them in the clean room.

The wafers arranged in the wafer carrier must be completely protected from the dust and, hence, are stored in a case consisting of a lid and a body. However, the conventionally used cases consisting of a lid and a body of polypropylene or polystyrene have the problem that adhering of fine dust cannot be prevented. On the other hand, wafer carriers made by molding cyclic olefin resins are known, but although contamination of the wafer surface is a little, they are open containers and attachment of fine dust cannot be prevented. Accordingly, the carriers must be stored in a case consisting of a lid and a body of polypropylene or polystyrene. Thus, attachment of fine dust cannot still be prevented.

In the uses where presence of even such very fine dust must be avoided, since the dust is too fine, it is difficult to scientifically analyze and know in which case the fine dust is generated and in which containers the fine dust is difficult to enter to prevent contamination of the contents with the fine dust.

As mentioned above, there have been known no containers made of thermoplastic resins the contents of which are hardly contaminated with water or organic substances permeating through the containers from the outside or released from the containers per se and are hardly contaminated with fine dust in handling.

SUMMARY OF THE INVENTION

The object of the present invention is to provide containers made of thermoplastic resins the content of which is hardly contaminated with water or organic substances permeating through the containers from the outside or released from the containers per se and is hardly contaminated with fine dust in handling.

As a result of intensive research conducted by the inventors, it has been found that thermoplastic cyclic olefin resins among thermoplastic resins are very low in permeability to water or basic organic substances which cause problems in the production of semiconductors as compared with other thermoplastic resins, contain substantially no water or impurities such as organic substances which are apt to convert to gases and hardly absorb them to result in substantially no contamination of the content, and, besides, when cyclic olefin resins are used for at least one of a body or a lid of containers, contamination of the content with dust can be considerably reduced at the time of opening and closing the containers as compared with containers made of other thermoplastic resins. Thus, the present invention has been accomplished.

That is, the present invention relates to a container made of a thermoplastic resin which comprises a body made of a thermoplastic resin and a lid made of a thermoplastic resin, characterized in that at least one of the body and the lid is molded from a thermoplastic cyclic olefin resin.

BRIEF DESCRIPTION OF THE DRAWING

In FIGS. 1–4, 1 indicates a lid, 2 indicates a hole, 3 indicates a body, 4 indicates a convex portion, 5 indicates a rib, and 6 indicates a concave portion in which fingers are inserted.

DETAILED DESCRIPTION OF THE INVENTION

Figure 1:
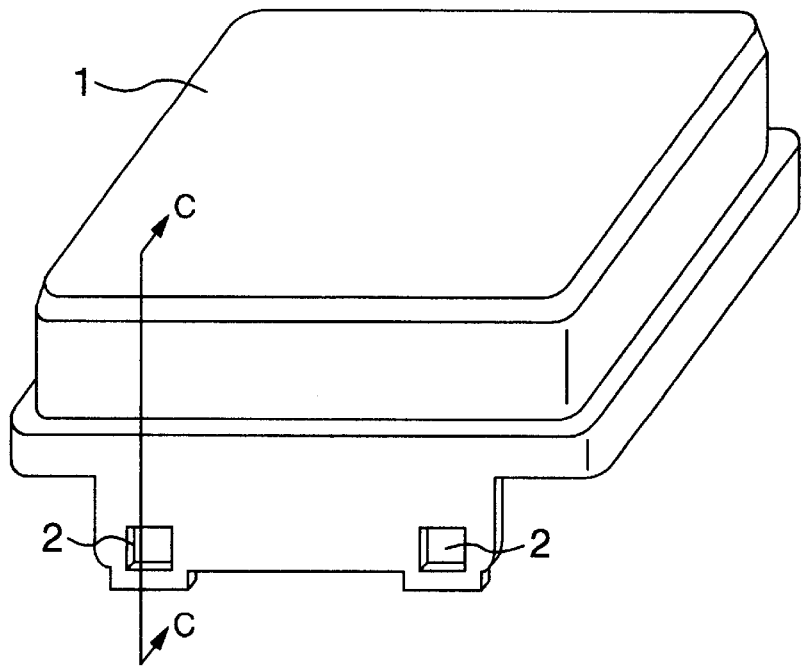
FIG. 1 is an oblique view of a lid.

The container of the present invention comprises a lid and a body both of which are made of a thermoplastic resin, characterized in that one or both of the lid and the body are made by molding a molding material comprising a cyclic olefin resin. The structure of the container is not limited as far as the container can be parted into two of the lid and the body or more parts. Moreover, the container may have other annexed parts in addition to the lid and the body, and these parts may comprise materials other than thermoplastic resins. When one of the body and the lid is not made of a cyclic olefin resin, this must be made of other thermoplastic resins, but the kind of the thermoplastic materials is not limited.

Preferred embodiments of the present invention will be explained on the respective items.

Molding Materials Comprising Cyclic Olefin Resins

As for the container of the present invention, the lid and the body are both made of thermoplastic resins and one or both of the lid and the body are made by molding a molding material comprising a cyclic olefin resin. The cyclic olefin resin is a non-crystalline and transparent olefin resin having a saturated hydrocarbon ring structure on the main chain or side chain of the polymer. As examples of the cyclic olefin resin, mention may be made of ring opening polymers of monomers having a norbornene ring or hydrogenation products thereof disclosed in JP-A-63-264646, JP-A-64-1705, JP-A-1-168724 and JP-A-1-168725, addition polymers of monomers having a norbornene ring with α-olefins disclosed in JP-A-60-168708, and addition polymers of cyclic olefins or cyclic dienes or hydrogenation products thereof disclosed in JP-A-6-136057 and JP-A-7-258362. These resins are available, for example, in the trademark of ZEONEX from Nippon Zeon Co., Ltd. and in the trademarks of APEL, APO, etc. from Mitsui Petrochemical Industries, Ltd.

Examples of the monomers having norbornene ring are bicyclo[2.2.1]hept-2-ene which is a bicyclic olefin and an adduct of ethylene and cyclopentadiene (popular name: norbornene), tetracyclo[4.4.0.1$^{2.5}$.1$^{7.10}$]-dodec-3-ene which is tetracyclic olefin obtained by adding cyclopentadiene to norbornene (which may be called merely tetracyclodecene), tricyclo[4.3.0.1$^{2.5}$]deca-3,7-diene which is a tricyclic diene and a dimer of cyclopentadiene (popular name: dicyclopentadiene), tricyclo[4.3.0.1$^{2.5}$]dec-3-ene which is a tricyclic olefin obtained by saturating a part of the unsaturated bond of the dicyclopentadiene by hydrogenation, pentacyclo[6.5.1.1$^{3.6}$.0$^{2.7}$.0$^{9.13}$]pentadeca-3,10-diene and pentacyclo[7.4.0.1$^{3.6}$.1$^{10.13}$.0$^{2.7}$]pentadeca-4,11-diene which are trimers of cyclopentadiene and pentacyclic dienes, pentacyclo[6.5.1.1$^{3.6}$.0$^{2.7}$.0$^{9.13}$]pentadeca-3,10-diene and pentacyclo[7.4.0.1$^{3.6}$.1$^{10.13}$.0$^{2.7}$]pentadeca-4,11-diene which are pentacyclic olefins obtained by saturating a part of the unsaturated bond of the above pentacyclic dienes; and substitution products thereof. As the substitution products, mention may be made of derivatives obtained by substitution with groups having no polar group such as alkyl group, alkylidene group or aromatic group or hydrogenation derivatives or derivatives obtained by dehydrogenation of these derivatives (for example, bicyclic norbornene derivatives such as 2-methyl-bicyclo[2.2.1]hept-2-ene, 2,2-dimethyl-bicyclo[2.2.1]hept-2-ene, 2-ethyl-bicyclo[2.2.1]hept-2-ene, 2-butyl-bicyclo[2.2.1]hept-2-ene, 2-hexyl-bicyclo[2.2.1]hept-2-ene, 2-phenyl-bicyclo[2.2.1]-hept-2-ene, 2-octyl-bicyclo[2.2.1]hept-2-ene, 2-octadecylbicyclo[2.2.1]hept-2-ene, and 2-ethylidene-2-norbornene, and tetracyclic derivatives having tetracyclododecene (tetracyclic) structure such as 8-methyl-tetracyclo-[4.4.0.1$^{2.5}$.1$^{7.10}$]-dodec-3-ene, 8-ethyl-tetracyclo-[4.4.0.1$^{2.5}$.1$^{7.10}$]-dodec-3-ene, 8-methylidene-tetracyclo-[4.4.0.1$^{2.5}$.1$^{7.10}$]-dodec-3-ene, 8-methylidene-tetracyclo-[4.4.0.1$^{2.5}$.1$^{7.10}$]-dodec-3-ene, 8-ethylidene-tetracyclo-[4.4.0.1$^{2.5}$.1$^{7.10}$]-dodec-3-ene, 8-vinyl-tetracyclo-[4.4.0.1$^{2.5}$.1$^{7.10}$]-dodec-3-ene, and 8-propenyl-tetracyclo-[4.4.0.1$^{2.5}$.1$^{7.10}$]-dodec-3-ene); substitution products obtained by substitution with a polar group such as halogen, hydroxyl group, ester group, alkoxy group, cyano group, amide group, imide group, or silyl group (for example, 5-methoxy-bicyclo[2.2.1]hept-2-ene, 5-cyano-bicyclo [2.2.1]hept-2-ene, 5-methyl-5-methoxycarbonyl-bicyclo [2.2.1]hept-2-ene, and 3-methyl-3-methoxycarbonyl-tetracyclo[4.4.0.1$^{2.5}$.1$^{7.10}$]-dodec-3-ene). Of these norbornenes, preferred are those having no polar group because the containers made of them cause less contamination of the content therein.

The α-olefins include olefins in a narrow sense, such as ethylene, propylene, 1-butene, and 4-methylpentene-1, and, in addition, olefinic monomers obtained by substituting a part of them with a polar group such as halogen.

As examples of the cyclic olefins, mention may be made of monocyclic cycloolefins such as cyclobutene, 1-methylcyclopentene, 3-methylcyclobutene, 3,4-diisopropenylcyclobutene, cyclopentene, 3-methylcyclopentene, cyclohexene, cyclooctene, 1-methylcyclooctene, 5-methylcyclooctene, cyclooctatetraene and cyclododecene, and the above-mentioned monomers having norbornene ring which have one unsaturated bond.

As examples of the cyclic dienes, mention may be made of monocyclic dienes such as cyclopentadiene, 1,3-cyclohexadiene and 1,4-cyclohexadiene, and the above-mentioned monomers having norbornene ring which have two unsaturated bonds.

Furthermore, in both the ring opening polymerization and the addition polymerization, there may be copolymerized with various copolymerizable monomers in the catalyst systems in which the polymerization is to be carried out. The copolymerizable monomers include, for example, the above monomers having norbornene ring, α-olefins, cyclic olefins, cyclic dienes, and, in addition, straight chain or branched chain dienes such as butadiene and isoprene. The polymerization may be random type, block type or alternating type, and when there are 1,2- and 1,4-additions in the addition polymerization, either of them may be main addition.

In case the unsaturated bond remains in the polymer after polymerization, namely, in the case of the ring opening polymers of monomers having norbornene ring or the addition polymers of cyclic dienes, weathering stability and heat stability of the polymers are deteriorated due to the remaining unsaturated bond. For overcoming these problems, it is preferred to saturate at least 80%, preferably at least 90% of the unsaturated bond by hydrogenation. Known hydrogenation processes and hydrogenation catalysts can be used for the hydrogenation.

Among these cyclic olefin resins, preferred are the hydrogenation products of the ring opening polymers of the monomers having norbornene ring (norbornenes) because they contain less low-molecular components and impurities such as catalyst residues and metals, are less in contamination of contents in the containers made of them, and are high in transparency. In the case of the hydrogenation products of the ring opening polymers of norbornenes, amount of the bicyclic or tricyclic norbornene is 50% by weight or more, preferably 60% by weight or more, especially preferably 70% by weight or more and 100% by weight or less. When the amount of norbornenes is in the above range, the molded containers are highly balanced in properties such as impact resistance and heat resistance and, besides, have flexibility. Therefore, the containers are satisfactory in endurance when they are repeatedly used with the lid and the body being combined to form a closed structure. Furthermore, in the ring opening polymerization, the total amount of the norbornenes in the all monomers is 70% by weight or more, preferably 80% by weight or more, especially preferably 90% by weight or more and 100% by weight or less. In this case, activity of the ring opening polymerization reaction is high and the above range is suitable.

Molecular weight of the polymer is measured by gel permeation chromatography in the form of a solution of the polymer in a good solvent of the polymer, such as toluene or tetrahydrofuran. A polyisoprene-reduced number-average molecular weight (Mn) is preferably 12,000–50,000, and a polyisoprene-reduced weight-average molecular weight (Mw) is preferably 20,000–80,000.

It is also preferred to remove the residues such as catalysts from the polymer solution after polymerization or hydrogenation or reduce the amount of them by known methods. The method for recovery of the polymer from the polymer solution is also not limited, but it is important to remove the remaining volatile matter as much as possible. For example, the following methods can be employed: a method which comprises carrying out the washing as described for removal of the catalysts, then removing the solvent by filtration, and further heating or vacuum heating and a method which comprises removing the solvent by directly heating or vacuum heating the resin solution from which metal contaminants have been removed by precipitation agglomeration method.

The heat resistance of the cyclic olefin resins is expressed, for example, by glass transition temperature. The glass transition temperature varies depending on the kind of monomers, the proportion of comonomers when copolymerization is carried out, the molecular weight, the hydrogenation rate, and others, but is preferably 40–250, more preferably 50–200 since the cyclic olefin resins having a glass transition temperature within the above range have at least a heat resistance enough not to deform at room temperature and can be easily molded when they are used as molding materials for molding the containers of the present invention. Especially when the containers have a closed structure and are required to have endurance in repeated use, Tg is particularly preferably 70–120. Within this range, sufficient endurance and flexibility to stand repeated use and heat resistance of the container are highly well balanced, and thus this range is suitable.

In the case of containers especially for semiconductor devices, it is preferred that less foreign matters such as dust are generated, and, thus, the cyclic olefin resins preferably contain less foreign matters. In order to diminish the foreign matters, for example, the polymer solution after polymerization reaction or hydrogenation reaction is filtered by a filter having a pore diameter of 0.2 μm or less, whereby metal residues and foreign matters can be thoroughly removed.

The cyclic olefin resins can contain various additives which are commonly used in the field of resin industry as far as the object of the present invention is not damaged.

Stabilizers used as the additives include, for example, phenolic antioxidants, phosphorus antioxidants and sulfur antioxidants. Among them, phenolic antioxidants are preferred, and alkyl-substituted phenolic antioxidants are particularly preferred. Moreover, those which have a vapor pressure of $10^{-6}$ Pa or lower at 20° C. are desired for the inhibition of volatilization at the time of molding. These stabilizers may be used each alone or in combination of two or more. Amount of the stabilizers can be optionally selected depending on the purpose, and is usually in the range of 0.001–10 parts by weight based on 100 parts by weight of the cyclic olefin polymer.

Furthermore, lubricants are used, as required, for the purpose of improving moldability. Examples of the lubricants are partial esters of polyhydric alcohols, full esters of polyhydric alcohols (polyhydric alcohols in which at least 95% of alcoholic hydroxyl groups are esterified), higher saturated alcohols, and partial ethers of polyhydric alcohols. Among them, preferred are full esters of polyhydric alcohols, and especially preferred are full esters of polyhydric alcohols with OH group-containing higher saturated fatty acids or higher saturated alcohols. Moreover, those which have a vapor pressure of $10^{-6}$ Pa or lower at 20° C. are desired for the inhibition of volatilization at the time of molding. Amount of the lubricants can be optionally selected depending on the purpose, and usually is 10 parts by weight or less, preferably 5 parts by weight or less, more preferably 3 parts by weight or less based on 100 parts by weight of the cyclic olefin polymer. If the amount of the lubricant is too large, it bleeds out of the surface of molded products and is apt to cause contamination of the content. Therefore, in such a use as containers for wafers used for the production of semiconductors where contamination of the content must be avoided, lubricants are preferably not used or are in an amount of less than 1 part by weight if used.

For the purpose of improving moisture resistance and moldability, a rubber-like polymer may be added in such a small amount as not damaging transparency of the container when the container is needed to have transparency. In general, rubber-like polymers are low in glass transition temperature and low in compatibility with the cyclic olefin resins. Therefore, addition of the rubber-like polymer in an excessively large amount results in deterioration of heat resistance and transparency of the mixture. However, the rubber-like polymer can be dispersed in the state of fine particles of 0.3 μm or less, especially 0.2 μm or less in diameter in the cyclic olefin resin as a matrix by reducing the amount of the rubber-like polymer or by selecting the method of addition or kneading. As a result, transparency of the container obtained is not damaged. In this case, the smaller the difference in refractive index of the rubber-like polymer and the cyclic olefin resin, the higher the transparency of the container.

The rubber-like polymers are preferably those which are known in JP-A-5-247324. As examples of the rubber-like polymers, mention may be made of styrene random or block copolymers such as styrene-butadiene rubber or hydrogenation products thereof and styrene-isoprene-styrene block copolymer or hydrogenation products thereof; chloroprene rubber or hydrogenation products thereof; isoprene rubber or hydrogenation products thereof; ethylene-propylene copolymer, ethylene-α-olefin copolymer, propylene-α-olefin copolymer; and the like. Among them, hydrogenation products of styrene-butadiene-styrene block copolymer and hydrogenation products of styrene-isoprene-styrene block copolymer are preferred from the points of heat resistance and difference in refractive index.

Amount of the rubber-like polymer in the case of transparency being necessary for the container varies depending on the difference in refractive index of the rubber-like polymer and the cyclic olefin resin which is a matrix, and is 0.01–10 parts by weight, preferably 0.02–5 parts by weight, more preferably 0.05–1 part by weight based on 100 parts by weight of the cyclic olefin resin. Within this range, the heat resistance and the moisture resistance of the containers are highly balanced and this is desirable.

When the containers do not need to have transparency, the rubber-like polymer can be added in a large amount to improve endurance of the containers, for example, closed containers that are repeatedly opened and closed. Amount of the rubber-like polymer to be added for this purpose is 1–200 parts by weight, preferably 5–100 parts by weight based on 100 parts by weight of the cyclic olefin resin. Within this range, the heat resistance and the endurance of the containers are well balanced and this is favorable.

Thermoplastic resins other than cyclic olefin resins can also be added to the cyclic olefin resin as far as attainment of the object of the present invention is not hindered. As examples of these thermoplastic resins, mention may be made of polyolefins such as low-density polyethylene, high-density polyethylene, straight chain low-density polyethylene, ultra-low density polyethylene, polypropylene, syndiotactic polypropylene, polybutene, and polypentene; polyesters such as polyethylene terephthalate and polybutylene terephthalate; polyamides such as nylon 6 and nylon 66; ethylene-ethyl acrylate copolymer, ethylene-vinyl acetate copolymer, polystyrene, syndiotactic polystyrene, polyphenylene sulfide, polyphenylene ether, polyamides, polyesters, and polycarbonates. Amount of these other resins to be added is usually 100 parts by weight or less, preferably 50 parts by weight or less based on 100 parts by weight of the cyclic olefin polymer not so as to damage the characteristics of the cyclic olefin polymer, and most preferably these resins are not used.

Examples of other additives are dyes, antistatic agents, ultraviolet absorbers, light stabilizers and waxes. These other additives can be used each alone or in combination of two or more. Amount of these additives can be optionally selected in such a range as not damaging the object of the present invention.

These additives may be added to the cyclic olefin resin after isolation, by melt-mixing using various kneaders such as single-screw extruder, twin-screw extruder, roll, and Banbury mixer. Suitably, they are added to the cyclic olefin resin solution before subjecting to filtration. Moreover, they may be added in the form of solutions in their suitable solvents, and, if necessary, the solutions may be heated and then added. Similarly, the cyclic olefin resin solution may also be previously heated. The cyclic olefin resin is often processed into a size of a grain of rice, namely, pellets, for easy handling at the time of injection molding. In this way, a molding material comprising the cyclic olefin resin is obtained by adding necessary additives to the cyclic olefin resin.

Other Thermoplastic Resin

When not all of the body and the lid of the container according to the present invention are molded from the molding material comprising the cyclic olefin resin, the portions of the body or the lid which are not molded from the molding material comprising the cyclic olefin resin are made of other thermoplastic resins. These other thermoplastic resins are not limited, and examples of them are molding materials mainly composed of polyolefins such as low-density polyethylene, high-density poly-ethylene, straight chain low-density polyethylene, ultra-low density polyethylene, polypropylene, hydrogenated polystyrene, syndiotactic polypropylene, polybutene, and polypentene; polyesters such as polyethylene terephthalate and polybutylene terephthalate; polyamides such as nylon 6 and nylon 66; ethylene-ethyl acrylate copolymer, ethylene-vinyl acetate copolymer, polystyrene, syndiotactic polystyrene, polyphenylene sulfide, polyphenylene ether, polyamides, polyesters, and polycarbonates. Among them, polyolefins are preferred because they cause less contamination of contents, and, in the case of closed type containers, molding materials mainly composed of flexible polyolefins such as low-density polyethylene, high-density polyethylene, straight chain low-density polyethylene, ultra-low density polyethylene, polypropylene, polybutene, and polypentene are preferred from the point of endurance of the containers when repeatedly opened and closed.

In the containers of the present invention, a lid or a body which is made of a thermoplastic resin other than the thermoplastic cyclic olefin resin can be used, but it is especially preferred that both the lid and the body are molded from molding materials comprising the cyclic olefin resin. This is because use of these containers results in further less contamination of the content caused externally or internally by the containers per se or caused by fine dust.

Molding Method

The containers of the present invention are obtained by molding the above molding materials. The molding methods may be conventional methods, such as, for example, injection molding, extrusion blow molding, injection blow molding, multi-layer blow molding, connection blow molding, double-wall blow molding, stretching blow molding, vacuum molding, and rotational molding. Melting temperature of the resin at molding is usually 200–350° C., though it depends on the kind of the cyclic olefin resin. Furthermore, as is known in JP-A-4-276253, it is possible depending on the purpose to further enhance gas barrier properties, weathering resistance and light resistance by carrying out multi-layer molding or double-wall molding with other resins.

Containers

The structure of the container has no limitation as far as it can be parted to two portions of a lid and a body or more portions. Moreover, the container may have annexed parts in addition to the lid and the body, and these parts may be made of other materials than thermo-plastic resins. There is no need to make discrimination as to which portion should be called a body and which portion should be called a lid when the container is parted to two or more portions (normally two portions). However, in case the container can be parted to the upper and lower portions, in many cases the lid is the upper portion when the container is placed in the regular manner. However, when the container has the structure of being able to be parted in lateral direction, in many cases the relatively larger portion is called a body and the smaller portion is called a lid. Furthermore, in case the content can be seen through the container and only either one of the body and the lid is transparent, the transparent portion (through which the content is seen) is sometimes called the lid.

In the present invention, it is preferred that at least one of the body and the lid of the container is transparent. This is because the content can be recognized from the outside.

In the present invention, in order to exhibit the function to inhibit contamination of the content, the container preferably has a closed structure in the state of the body and the lid being combined (with the annexed parts in some case). The closed structure means that the inside and the outside of the container are not connected through space. The closed structure can be attained by designing the shapes of the body and the lid so that no opening is formed when the body and the lid are combined. In the case of a small opening of less than about 1 mm, the opening may be stopped with an adhesive tape after the body and the lid are combined.

Figure 2:
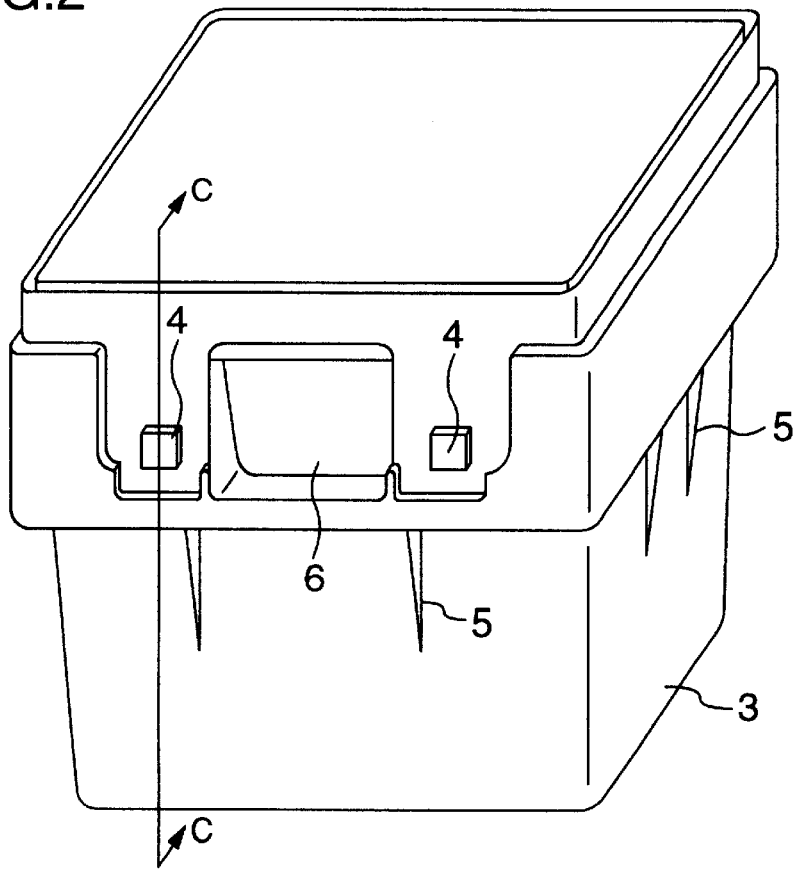
FIG. 2 is an oblique view of a body.
Figure 3:
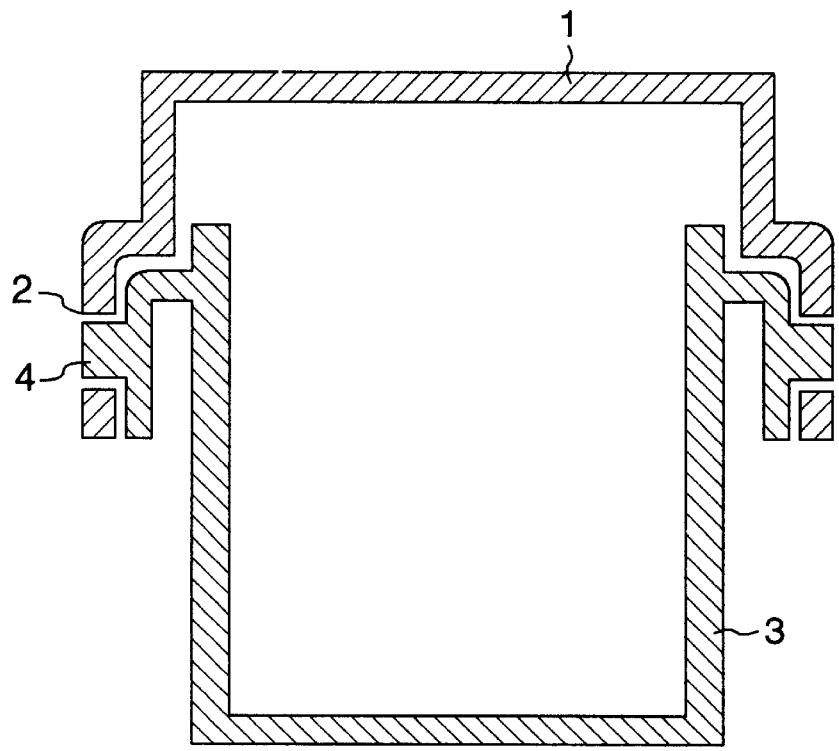
FIG. 3 is a sectional view of an essential part of a container in the state of the lid and the body being combined, taken on line C—C of FIG. 1 and FIG. 2.

FIGS. 1–4 illustrate typical examples of the container of the present invention. FIG. 3 is a sectional view of the essential part in the state of the body and the lid being combined. In the container of FIG. 3, at the corresponding positions of the lid 1 and the body 3 there are provided a convex portion 4 and a concave portion 2 which are combined in fitting manner to prevent the body and the lid from parting. The container of the present invention preferably has such a structure that the convex portion and the concave portion are combined in fitting manner at the corresponding positions of the lid and the body. The convex portion can be provided at the lid and the concave portion can be provided at the body, or the convex portion can be provided at the body and the concave portion can be provided at the lid. The concave portion may be a hole. The convex portion and the concave portion may be repeatedly provided in the wavy form to be combined in fitting manner. The convex portion and the concave portion are in one set or more, preferably two sets or more to inhibit the lid and the body from parting from each other.

As another structure having the similar function, a hook-shaped projection may be formed on either one of the lid or the body and a portion which is caught with said hook may be formed at the corresponding position of the other lid or body. As explained above, the structure is preferably such that the convex portion and the concave portion or the hook-shaped projection and the portion to be caught with the projection are combined in fitting manner at the corresponding positions of the lid and the body, respectively.

Figure 4:
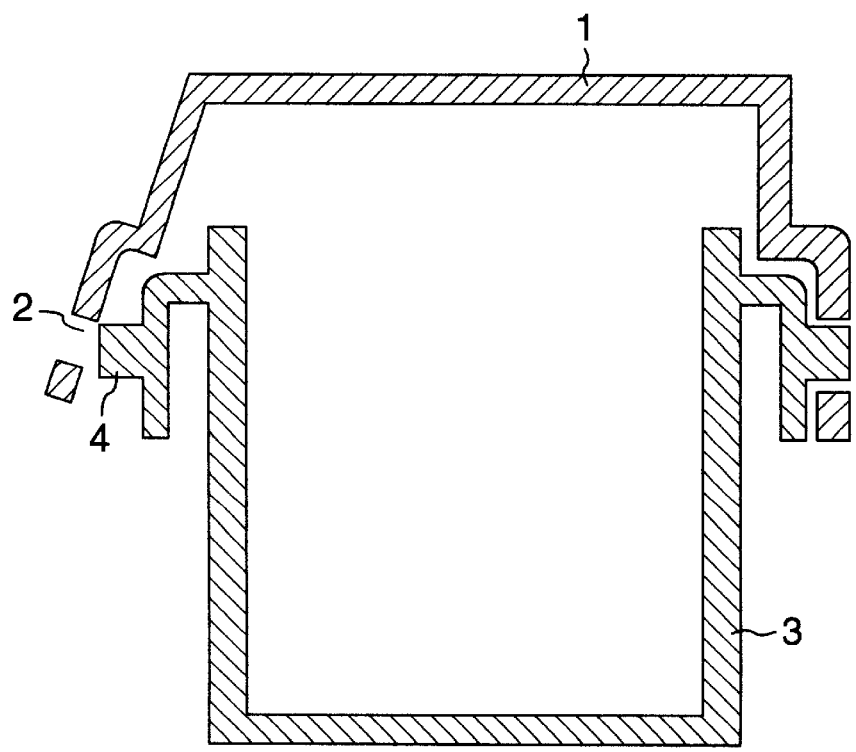
FIG. 4 is a sectional view of an essential part of a container just before the lid and the body are combined, taken on line C—C of FIG. 1 and FIG. 2.

In the case of the combination of the convex portion and the concave portion, when the body is covered with the lid, the convex portion is fitted in the concave portion by bending the lid in such a manner as expanding the opening of the lid and removing the bending force upon the convex portion and the concave portion reaching the same height as shown in the sectional view of an essential part of FIG. 4. Therefore, the material of the lid must have flexibility and endurance against repetition of bending. Accordingly, in the case of the container having the structure where the convex portion and the concave portion are combined with each other in fitting manner at the corresponding positions of the lid and the body, the molding materials used for making them preferably have the endurance and flexibility capable of standing repeated use, and especially preferred are cyclic olefin resins having a Tg of 70–120° C.

Containers for Wafers and Glass Substrates used for Production of Electronic Devices The containers of the present invention may be provided with a storing part for wafers used for producing semiconductors or glass substrates used for producing electronic devices. The storing part here is a part which can house a plurality of wafers (normally, about 10–25 wafers) so that each wafer is parallel to the adjoining wafers and so that two adjacent wafers are not mutually rubbed or overlapped. By employing such construction, the wafers do not come into contact each other, and it is also possible to shield the wafers from pollution (peels from containers or the like) and damage.

Therefore, the containers of the present invention are suitable as containers for wafers used for producing semiconductors, especially, as containers for carrying wafers used for producing semiconductors. Wafers used for producing semiconductors are those for producing semiconductor devices such as integrated circuits and are single crystals of silicon or compound crystals of germanium which are processed into discs. Wafers for producing semiconductors must be sometimes stored or carried at the initial or intermediate stage of processing in various states such as a fresh and unprocessed state, a state of being provided with a nitride film or an oxide film on the surface, a state of being provided with a photoresist layer for the processing of the surface, a state of the photoresist layer being exposed latent-imagewise, and a state of being developed after exposure. In this case, usually, a plurality of wafers are arranged in a wafer carrier in which the wafers can be arranged in parallel out of contact with each other, and this wafer carrier is stored in a wafer case or the wafers are stored in a wafer shipper comprising a wafer carrier and a container which are integrally molded. The containers of the present invention are suitable as containers for wafers used for producing semiconductors, such as wafer cases and wafer shippers because they cause little contamination of the content. Especially, since they cause little contamination of the content even when stored and transferred for a long time, they are suitable as containers for carrying wafers used for producing semiconductors.

The size of the wafers for semiconductors which can be stored is not only 3–6 inches (diameter of the wafer), but also 8 inches or 12 inches. With increase of the diameter of the wafers, the containers are also increased in size (about 250 mm in side for the wafers of 8 inches and about 350 mm in side for the wafers of 12 inches) and are required to have the further higher mechanical strength and flexibility, and further severely demanded to inhibit the contamination caused by the container per se or by the environment. Therefore, the containers of the present invention are especially suitable for storing and carrying wafers of 8 inches or more.

Moreover, the containers of the present invention cause little contamination of the contents with dust, and, hence, are suitable as containers for glass substrates used for producing electronic devices, for example, glass substrates for photo masks or reticles used for producing semiconductor devices and glass substrates for producing liquid crystal display devices.

According to the present invention, there are provided containers made of thermoplastic resins the contents of which are hardly contaminated with water or organic substances permeate through the containers from the outside or are released from the containers per se and are hardly contaminated with fine dust in handling. The containers of the present invention can effectively prevent various contamination of the contents, and are especially suitable for storing and carrying the contents which are susceptible to contamination. The containers of the present invention are suitable as containers for wafers used for producing semiconductors and those for glass substrates used for producing electronic devices.

DESCRIPTION OF PREFERRED EMBODIMENTS

The present invention will be explained in more detail by the following examples, which never limit the present invention. Molding of the containers was carried out under down-flowing of clean air. Other tests were conducted in a clean room (class 1000), and wafers were handled with wearing a long-sleeved dustless frock and dustless gloves of synthetic latex having a thickness of about 50 μm and without exposing the bare skin of arms and hands and with using exclusive tweezers (made of SUS) for wafers.

First, test methods will be explained.

Molding of Containers

A lid and a body of a wafer case having the shapes as shown in FIG. 1 and FIG. 2 were produced by injection molding various molding materials. When a storing part is provided, a wafer carrier is independently prepared, a plurality of wafers are housed therein, and then the wafer carrier is contained within the body of the wafer case. The main portion (the flat portion) of the lid shown in FIG. 1 had a thickness of 3 mm, and the main portion of the body shown in FIG. 2 had a thickness of 3 mm. The opening of the body of FIG. 2 was nearly square and had a side length of about 220 mm, and this was a size capable of storing a wafer carrier for wafers of 8 inches. The hole 2 of the lid had a shape of square having a side of 20 mm, and the convex portion 4 of the body had a shape of square having a side of 15 mm and a height of 3 mm. Temperature of the resin at injection molding was changed depending on the molding materials. The injection molding was carried out using an injection molding machine of 350 tons in clamping pressure. For storing wafers of 8 inches, they are put in a carrier and then stored in the container shown in FIGS. 1–2. However, if contamination is caused by the carrier, the superiority or inferiority of the container against contamination cannot be judged. Therefore, a carrier having a shape capable of storing twenty-five wafers of 8 inches was prepared by molding the same molding material as used for the container of the present invention (the molding material of Preparation Example 1 mentioned hereinafter) and the resulting carrier was used.

Test on Contamination with Organic Substances

The surface of fresh bare (single crystal) silicon wafers of 8 inches bought in the state of being packed in a wafer shipper made of polypropylene (which were considerably contaminated; wafers in this state will be hereinafter referred to as "fresh wafers") was subjected to acid treatment in a clean room (class 1000) to remove the organic substances. The acid treatment was carried out by a method which comprises dipping the wafers in a 4.5 wt % hydrofluoric acid solution at 25° C. for 1 minute to remove a thin silicon oxide film, then dipping them in a mixed solution of a 98% concentrated sulfuric acid and a 30% aqueous hydrogen peroxide solution at a volume ratio of 50:1 at 110° C. for 10 minutes, then dipping them in concentrated sulfuric acid at 65° C. for 10 minutes to remove organic substances, washing them with a large amount of ultra-pure water to wash off the acid, and thereafter shaking water off by a centrifugal separator. The wafers in this state are hereinafter referred to as "acid-treated wafers".

Contact angle with pure water of the resulting acid-treated wafers was measured under the environmental conditions of 23° C., 40% RH (measured by CA-150 contact angle measuring apparatus manufactured by Kyowa Kaimen Kagaku Co.) to obtain 0° (water drops spread in a moment and measurement was impossible, namely, the contact angle was at most 2°, and, for reference, the contact angle measured on the fresh wafers was 32°). Twenty-five wafers treated in the above-mentioned manner were arranged in the carrier in a clean bench (class 100) and the carrier was stored in each of the containers (the carrier in which the wafers were arranged was placed in the body of the container and the lid was put thereon). After 48 hours, the wafers were taken out and contact angle with pure water was measured. The results of the measurement of the contact angle on twenty-five wafers were graded by the following criteria. When the contact angle was smaller than 10°, this is indicated by ⊙ (i.e., the surface had substantially no contamination); when 10° or greater and smaller than 20°, this is indicated by ○ (i.e., the surface had some contamination, but this is acceptable in practical use of wafers); when 20° or greater and smaller than 32°, this is indicated by Δ (better than when stored in a polypropylene container for a long time); and when greater than 32°, this is indicated by X.

Test on Contamination with Dust

The number of dust particles of 0.2 μm or more adhering to the surface of fresh wafers was counted on the whole surface (WM3 type fine particle measuring apparatus manufactured by Topcon Co., Ltd.) to obtain 21 per one wafer on the average for twenty-five wafers, and the number of dust was less than 50 on all the wafers. Then, the twenty-five fresh wafers were put in the wafer carrier made hereabove in a clean bench. This wafer carrier was stored in the containers of the respective examples, and opening and closing of the containers were carried out 100 times. Thereafter, the number of dust on the whole surface of the wafers was again counted. The results were graded by the following criteria. That is, when the number of dust was 21 or more and less than 30 per one wafer, this is indicated by ○ (substantially no increase in the number of dust), when 30 or more and less than 50 per wafer, this is indicated by Δ (some increase in the number of dust, but acceptable in practical use of wafers), and when 50 or more, this is indicated by X (unacceptable in practical use of wafers).

Endurance Test

In the above test on contamination with dust, when whitening or cracking did not occur at the four corners of the lid and at the peripheral portions of holes 2 of the container after opened and closed 100 times, this is indicated by ○, and when whitening or cracking occurred, this is indicated by X.

PREPARATION EXAMPLE 1 OF MOLDING MATERIAL

In a nitrogen atmosphere, 100 parts by weight of tricyclo [4.3.0.1$^{2,5}$]deca-3,7-diene (a tricyclic norbornene having a popular name of dicyclopentadiene manufactured by Nippon Zeon Co., Ltd., purity: at least 95% by weight; hereinafter referred to as "DCP") was polymerized with a metathesis ring opening polymerization catalyst system containing hexachloro tungsten, triethylaluminum and diisopropyl ether, and then the resulting polymer was hydrogenated by using Ni-kieselguhr catalyst as a hydrogenation catalyst and activated alumina at 150° C. under a hydrogen pressure of 10 kg/cm$^2$ to obtain a cyclic olefin resin which was a hydrogenation product of DCP ring opening polymer. The Ni-kieselguhr catalyst and the activated alumina was removed by filtration, and then the reaction mixture was poured into isopropyl alcohol to carry out coagulation. The hydrogenated DCP ring opening polymer obtained was vacuum dried. To 100 parts by weight of the dried resin was added 0.2 part by weight of a phenolic aging inhibitor: pentaerythrityl-tetrakis(3-(3,5-di-tert-butyl-4-hydroxyphenyl)propionate), and a molding material in the form of pellets was obtained by mixing by a twin-screw extruder at 200° C. and pelletizing. The resulting pellets had a Tg of 97° C. (measured by DSC) and were transparent. This hydrogenated DCP ring opening polymer had a polyisoprene-reduced number-average molecular weight Mn of 13,000 measured by GPC (gel permeation chromatography) using cyclohexane as a solvent and a hydrogenation rate of 99.8% or more obtained by the comparison before and after hydrogenation reaction according to proton NMR method.

PREPARATION EXAMPLE 2 OF MOLDING MATERIAL

A molding material in the form of pellets was obtained in the same manner as Preparation Example 1, except that to 100 parts by weight of the dried resin were added 0.2 part by weight of the phenolic aging inhibitor and, furthermore, 20 parts by weight of hydrogenated styrene-isoprene block copolymer (CEPTON 4055 manufactured by Kuraray Co., ltd.; the total styrene content: 30% by weight; weight-average molecular weight: 280,000; iodine value: 4 g/100 g). The pellets were whitish and opaque.

PREPARATION EXAMPLE 3 OF MOLDING MATERIAL

A molding material in the form of pellets was obtained in the same manner as in Preparation Example 1, except that 70 parts by weight of DCP and 30 parts by weight of 8-ethyl-tetracyclo[4.4.0.1$^{2,5}$.1$^{7,10}$]-dodec-3-ene (a tetracyclic norbornene; popular name: ethyltetracyclo-dodecene hereinafter referred to as "ETD") (100 parts by weight in total) were used in place of 100 parts by weight of DCP. The dried resin had a polyisoprene-reduced number-average molecular weight Mn of 14,100 and a hydrogenation rate of 99.8% or more. The pellets had a Tg of 110° C. and were transparent.

EXAMPLE 1

A container was obtained by molding the lid of FIG. 1 and the body of FIG. 2 using the molding material of Preparation Example 1. Resin temperature at injection molding was 270° C. (Similarly, a wafer carrier which was used in all of the examples was molded using the molding material.) The test results are shown in Table 1.

EXAMPLE 2

A container was obtained by molding the lid in the same manner as in Example 1 and molding the body of FIG. 2 using the molding material of Preparation Example 2. Resin temperature was 250° C. at injection molding of the body using the molding material of Preparation Example 2. The test results are shown in Table 1.

EXAMPLE 3

A container was obtained by molding the lid in the same manner as in Example 1 and molding the body of FIG. 2 using a polypropylene resin (CHISSO POLYPRO K-1800 manufactured by Chisso Corporation). Resin temperature was 220° C. at injection molding of the body using the polypropylene resin. The test results are shown in Table 1.

EXAMPLE 4

A container was obtained by molding the lid of FIG. 1 and the body of FIG. 2 using the molding material of Preparation Example 3. Resin temperature at injection molding was 280° C. The test results are shown in Table 1.

COMPARATIVE EXAMPLE 1

A container was obtained by molding the lid of FIG. 1 and the body of FIG. 2 using a polycarbonate resin (PANLITE L-1250 manufactured by Teijin, Limited). Resin temperature at injection molding was 300° C. The test results are shown in Table 1.

COMPARATIVE EXAMPLE 2

A container was obtained by molding the lid of FIG. 1 and the body of FIG. 2 using the polypropylene resin of Example 3. Resin temperature at injection molding was 220° C. The test results are shown in Table 1.

COMPARATIVE EXAMPLE 3

A container was obtained by molding the lid of FIG. 1 and the body of FIG. 2 using a polystyrene resin (GP POLYSTYRENE 666R manufactured by Asahi Kasei Kogyo K. K.). Resin temperature at injection molding was 200° C. The test results are shown in Table 1.

TABLE 1

| | Recognizability of content | Contamination with organic substances | Contamination with dust | Endurance |
|---|---|---|---|---|
| Example 1 | Good | ⊚ | ○ | ○ |
| Example 2 | Good | ⊚ | ○ | ○ |
| Example 3 | Good | ○ | ○ | ○ |
| Example 4 | Good | ⊚ | ○ | ○ |
| Comparative Example 1 | Good | x | Δ | ○ |
| Comparative Example 2 | Bad | Δ | Δ | ○ |
| Comparative Example 3 | Good | Δ | x | x |

What is claimed is:

1. A container comprising a body made of a thermoplastic resin and a lid made of a thermoplastic resin, said container having a closed structure having no holes connecting the inside and the outside of the container in the state of the body and the lid being combined, and having such a structure that a convex portion and a concave portion are fitted together at the corresponding positions of the lid and the body or that a hook-shaped projection is formed on any one of the lid and the body and a portion which is caught with said hook is formed at a corresponding portion of the other of the lid and body, wherein at least one of the body and the lid is made by molding a non-crystalline cyclic olefin resin which comprises an antioxidant having a vapor pressure of $10^{-6}$ Pa or lower at 20° C. and at least one polymer selected from the group consisting of (i) hydrogenation products of ring opening polymers of monomers having a norbornene ring and (ii) addition polymers of monomers having a norbornene ring and α-olefins.

2. A container according to claim 1, wherein the non-crystalline cyclic olefin resin is a hydrogenation product of a ring opening polymer of a monomer having a norbornene ring.

3. A container according to claim 1, wherein the non-crystalline cyclic olefin resin has a number-average molecular weight of 12,000–50,000 and a weight-average molecular weight of 20,000–80,000.

4. A container according to claim 1, wherein the non-crystalline cyclic olefin resin has a glass transition temperature of 40–250° C.

5. A container according to claim 1, wherein both of the body and the lid are made by molding the cyclic olefin resin.

6. A container according to claim 1, wherein at least one of the body and the lid is transparent.

7. A container according to claim 1, wherein the body made of a thermoplastic resin is a body having a storing part for substrates used for electronic materials.

8. A container according to claim 7, wherein the substrates for electronic materials are wafers used for producing semiconductors.

9. A container according to claim 7, wherein the substrates for electronic materials are glass substrates used for producing electronic devices.

10. A container according to claim 1 which is a container for wafers used for producing semiconductors.

11. A container according to claim 1 which is a container for carrying wafers used for producing semiconductors.

12. A container according to claim 1 which is a container for glass substrates used for producing electronic devices.

13. A container according to claim 2, wherein the proportion of the monomer having a norbornene ring in a total amount of monomers that constitute the non-crystalline cyclic olefin resin is at least 70% by weight.

14. A container according to claim 13, wherein the proportion of the monomer having a norbornene ring in the total amount of monomers that constitute the non-crystalline cyclic olefin resin is at least 80% by weight.

15. A container according to claim 14, wherein the proportion of the monomer having a norbornene ring in the total amount of monomers that constitute the non-crystalline cyclic olefin resin is at least 90% by weight.

16. A container according to claim 2, wherein a proportion of bicyclic and tricyclic monomer having a norbornene ring in a total amount of monomer having a norbornene ring and constituting the non-crystalline cyclic olefin resin is at least 50% by weight.

17. A container according to claim 16, wherein the proportion of bicyclic and tricyclic monomer having a norbornene ring in the total amount of monomer having a norbornene ring and constituting the non-crystalline cyclic olefin resin is at least 60% by weight.

18. A container according to claim 17, wherein the proportion of bicyclic and tricyclic monomer having a norbornene ring in the total amount of monomer having a norbornene ring and constituting the non-crystalline cyclic olefin resin is at least 70% by weight.

19. A container according to claim 18, wherein the proportion of bicyclic and tricyclic monomer having a norbornene ring in the total amount of monomer having a norbornene ring and constituting the non-crystalline cyclic olefin resin is 100% by weight.

20. A container according to claim 1, wherein the cyclic non-crystalline olefin resin is a hydrogenation product of a ring opening polymer of a monomer having a norbornene ring.

21. A container according to claim 1, wherein the cyclic non-crystalline olefin resin has a number-average molecular weight of 12,000–50,000 and a weight-average molecular weight of 20,000–80,000.

22. A container according to claim 1, wherein the cyclic non-crystalline olefin resin has a glass transition temperature of 40–250° C.

23. A container according to claim 1, wherein both of the body and the lid are made by molding the cyclic olefin resin.

24. A container according to claim 1, wherein at least one of the body and the lid is transparent.

25. A container according to claim 1, wherein the body made of a thermoplastic resin is a body having a storing part for substrates used for electronic materials.

26. A container according to claim 25, wherein the substrates for electronic materials are wafers used for producing semiconductors.

27. A container according to claim 25, wherein the substrates for electronic materials are glass substrates used for producing electronic devices.

28. A container according to claim 1 which is a container for wafers used for producing semiconductors.

29. A container according to claim 1 which is a container for carrying wafers used for producing semiconductors.

30. A container according to claim 1 which is a container for glass substrates used for producing electronic devices.

31. A container according to claim 20, wherein the proportion of the monomer having a norbornene ring in a total amount of monomers that constitute the non-crystalline cyclic olefin resin is at least 70% by weight.

32. A container according to claim 31, wherein the proportion of the monomer having a norbornene ring in the total amount of monomers that constitute the non-crystalline cyclic olefin resin is at least 80% by weight.

33. A container according to claim 32, wherein the proportion of the monomer having a norbornene ring in the total amount of monomers that constitute the non-crystalline cyclic olefin resin is at least 90% by weight.

34. A container according to claim 20, wherein a proportion of bicyclic and tricyclic monomer having a norbornene ring in a total amount of monomer having a norbornene ring and constituting the non-crystalline cyclic olefin resin is at least 50% by weight.

35. A container according to claim 34, wherein the proportion of bicyclic and tricyclic monomer having a norbornene ring in the total amount of monomer having a norbornene ring and constituting the non-crystalline cyclic olefin resin is at least 60% by weight.

36. A container according to claim 35, wherein the proportion of bicyclic and tricyclic monomer having a norbornene ring in the total amount of monomer having a norbornene ring and constituting the non-crystalline cyclic olefin resin is at least 70% by weight.

37. A container according to claim 36, wherein the proportion of bicyclic and tricyclic monomer having a norbornene ring in the total amount of monomer having a norbornene ring and constituting the non-crystalline cyclic olefin resin is 100% by weight.

38. A container according to claim 1, wherein the non-crystalline cyclic olefin resin contains substantially no contamination by organic substances.

39. A container according to claim 38, wherein a contact angle with pure water of wafers stored in the container for 48 hours is smaller than 20°.

40. A container according to claim 38, wherein a contact angle with pure water of wafers stored in the container for 48 hours is smaller than 10°.

41. A container comprising a body made of a thermoplastic resin and a lid made of a thermoplastic resin, and having such a structure that a convex portion and a concave portion are combined in fitting manner at the corresponding positions of the lid and the body or that a hook-shaped projection is formed on any one of the lid and the body and a portion which is caught with said hook is formed at a corresponding portion of the other of the lid and body, wherein the body and the lid is made by molding a non-crystalline cyclic olefin resin which comprises an antioxidant having a vapor pressure of $10^{-6}$ Pa or lower at 20° C. and at least one polymer selected from the group consisting of (i) hydrogenation products of ring opening polymers of monomers having a norbornene ring and (ii) addition polymers of monomers having a norbornene ring and α-olefins.

* * * * *